(12) United States Patent
Ng et al.

(10) Patent No.: US 8,334,797 B1
(45) Date of Patent: Dec. 18, 2012

(54) WIDEBAND HIGH RESOLUTION TIME-STRETCHED PHOTONIC ANALOG-TO-DIGITAL CONVERTER

(75) Inventors: Willie W. Ng, Agoura Hills, CA (US); George C. Valley, Los Angeles, CA (US); George Anthony Sefler, Redondo Beach, CA (US)

(73) Assignees: HRL Laboratories, LLC, Malibu, CA (US); Aerospace Corp., Los Angeles, CA (US)

( * ) Notice: Subject to any disclaimer, the term of this patent is extended or adjusted under 35 U.S.C. 154(b) by 82 days.

(21) Appl. No.: 12/763,965

(22) Filed: Apr. 20, 2010

(51) Int. Cl.
H03M 1/00 (2006.01)

(52) U.S. Cl. .................................................. 341/137

(58) Field of Classification Search .................. 341/137
See application file for complete search history.

(56) References Cited

U.S. PATENT DOCUMENTS

| | | | |
|---|---|---|---|
| 5,004,342 A | 4/1991 | Bernard et al. | |
| 5,327,215 A | 7/1994 | Bernard et al. | |
| 6,052,495 A | 4/2000 | Little et al. | |
| 6,157,274 A | 12/2000 | Tada et al. | |
| 6,160,826 A * | 12/2000 | Swanson et al. | 372/20 |
| 6,636,668 B1 | 10/2003 | Al-hemyari et al. | |
| 6,668,006 B1 | 12/2003 | Margalit et al. | |
| 6,852,556 B2 | 2/2005 | Yap | |
| 6,870,968 B2 * | 3/2005 | Griffin | 385/2 |
| 6,872,985 B2 | 3/2005 | Yap | |
| 6,970,619 B2 | 11/2005 | Baumann et al. | |
| 6,992,539 B1 | 1/2006 | How | |
| 7,215,848 B2 | 5/2007 | Tan | |
| 7,266,258 B2 | 9/2007 | Liu et al. | |
| 7,269,312 B2 * | 9/2007 | Ng et al. | 385/27 |
| 7,440,653 B2 | 10/2008 | Smith | |
| 7,447,387 B2 | 11/2008 | Shih et al. | |
| 7,561,605 B1 * | 7/2009 | Delfyett et al. | 372/25 |
| 8,019,185 B2 | 9/2011 | Yap | |
| 2004/0228564 A1 | 11/2004 | Gunn, III et al. | |
| 2005/0286602 A1 | 12/2005 | Gunn et al. | |
| 2006/0083456 A1 | 4/2006 | Burns et al. | |
| 2006/0215949 A1 | 9/2006 | Lipson et al. | |
| 2007/0009205 A1 | 1/2007 | Maleki et al. | |
| 2007/0206899 A1 | 9/2007 | Chu et al. | |
| 2007/0230856 A1 | 10/2007 | Yamazaki | |
| 2008/0080803 A1 | 4/2008 | Park et al. | |

(Continued)

OTHER PUBLICATIONS

Chou, J. et al., Photonic Bandwidth Compression Front End for Digital Oscilloscopes, IEEE Journal of Lightwave Technology vol. 27, No. 22, Nov. 2009 pp. 5073-5077.*

(Continued)

*Primary Examiner* — Howard Williams
(74) *Attorney, Agent, or Firm* — Ladas & Parry

(57) ABSTRACT

A method of performing analog to digital conversation of an analog signal $V_{in}(t)$, the method including the steps of: utilizing both of the complementary arms of an electro-optic modulator to recover the analog input signal $V_{in}(t)$, while using only one time-stretch element and one λ-demultiplexer after the electro-optic modulator. The single time-stretch element and one λ-demultiplexer serve to stretch and demultiplex the signals from both of the complementary output arms of the electro-optic modulator thereby improving and simplifying post-processing algorithms used to correct for static distortions and nonlinearities that originate from imperfect photonic hardware. Double-balanced photoreceivers are preferably coupled to outputs of the single λ-demultiplexer. The single time-stretch element is preferably implemented by a chirped fiber grating. Apparatus for carrying out the method is described.

17 Claims, 5 Drawing Sheets

U.S. PATENT DOCUMENTS

2009/0208209 A1    8/2009    Ng et al.
2010/0158429 A1    6/2010    Popovic
2010/0201345 A1*   8/2010    Gupta et al. .................... 324/96

OTHER PUBLICATIONS

Han, Y. et al., Photonic Time-Stretched Analog-to-Digital Converter: Fundamental Concepts and Practical Considerations, IEEE Journal of Lightwave Technology vol. 21 No. 12, Dec. 2003, pp. 3085-3013.*

Gupta, S. et al., Distortion Cancellation in Time-Stretch Analog-to-Digital Converter, IEEE Journal of Lightwave Technology vol. 25 No. 12, Dec. 2007, pp. 3716-3721.*

Valley, G.C. et al. Continuous Time Realization of Time-Stretch ADC, IEEE, International Topical Meeting on Microwave Photonics, Oct. 2006, pp. 1-3.*

Chou et al., 4-Channel Continuous-Time 77GSa/s ADC using Photonic Bandwidth Compression IEEE International Topical Meeting on Microwave Photonics, IEEE, Oct. 2007, pp. 54-57.*

Gupta and B. Jalali, "*Time-Warp correction and calibration in photonic time-stretch analog-to-digital convert*", Optics Letters, vol. 33, No. 22, Nov. 15, 2008.

G. Sefler, J. Conway and G. Valley, "*Wide Bandwidth, High Resolution Time-Stretch ADC Scalable to Continuous-Time Operation*", Conference on Lasers and Electro-Optics (CLEO) 2009.

Baltimore and R. Walden, "*Analog-to-Digital Conversion in the Early Twenty-First Century*", Wiley Encyclopedia of Computer Science and Engineering, John Wiley & Sons, 2008.

U.S. Appl. No. 12/560,409 to Ng, pending, unpublished (filed Sep. 15, 2009), commonly assigned with present patent application (081271) Office actions and Responses.

U.S. Appl. No. 13/114,594 to Yap et al., pending, unpublished (filed Apr. 24, 2011), commonly assigned with present patent application (071204-DIV) Office actions and Responses.

U.S. Appl. No. 12/131,088 to Yap, filed Jun. 1, 2008, Office actions and Responses.

U.S. Appl. No. 12/183,064 to Ng, filed Jun. 31, 2008, Office actions and Responses.

Borrelli et al., Josa B, vol. 16, No. 10, pp. 1672-1678, 1999.

C. Madsen, Journal of Lightwave Technology, vol. 18, No. 6, Jun. 2000, pp. 860-868.

Djordjev et al., IEEE Photonics Technology Letters, vol. 14, No. 6, Jun. 2002, pp. 828-830.

Driessen et al., Proc. of SPIE vol. 5956, 2005 Microresonators as promising building blocks for VLSI photonics.

Hill and Meltz, IEEE J. of Lightwave Technology, vol. 15, No. 8, pp. 1263-1275, 1997.

Hunt et al., EURASIP Journal on Applied Signal Processing, 2005:10.

Itoh et al., "Ultrafast Processes for Bulk Modification of Transparent Materials," MRS Bulletin, vol. 31, Aug. 2006, pp. 620-625.

K. Jinguji and M. Oguma, Journal of Lightwave Technology, vol. 18, No. 2, Feb. 2000, pp. 252-259.

K. Jinguji, Journal of Lightwave Technology, vol. 14, No. 8, Aug. 1996, pp. 1882-1898.

Jinguji et al., Journal of Lightwave Technology, vol. 13, No. 1, Jan. 1995, pp. 73-82.

Kannan et al., IEEE Journal of Lightwave Technology, vol. 24, No. 71, 2006, pp. 2637-2648.

Leconte et al., Applied Optics, vol. 36, No. 24, pp. 5923-5930, 1997.

Little et al., IEEE J. of Lightwave Technology, vol. 15, No. 6, 1997, pp. 998-1005.

Madsen, IEEE Photonic Technology Letters, vol. 10, No. 8, 1998, pp. 1136-1138.

Nasu et al., Optics Letters, vol. 30, No. 7, pp. 723-725, 2005.

Soref and Bennett, "Kramers-Kronig analysis of electro-optical switching in silicon," Proc. SPIE, vol. 704, pp. 32-37.

Yariv, Electronics Letters, vol. 36, No. 4, Feb. 2000, pp. 321-322.

\* cited by examiner

WIDEBAND HIGH RESOLUTION TIME-STRETCHED PHOTONIC ANALOG-TO-DIGITAL CONVERTER

CROSS REFERENCE TO RELATED APPLICATIONS

None

TECHNICAL FIELD

A photonic architecture that provides for high resolution (e.g., 8 effective number of bits (ENOB) or more), continuous time analog-to-digital conversion (ADC) of a wideband (e.g., 10 GHz) RF signal modulated onto a chirped optical carrier.

BACKGROUND

Trends in performance requirements call for increased data rates and use of wideband RF signals in many electronic systems, including electronic warfare (EW) applications. Moreover, electromagnetic immunity (EMI) requirements also point towards the deployment of fiber optic links on defense and other sensitive aerial platforms. These platforms—which include tactical platforms and surveillance aircraft—typically require at least 10 GHz of receiver coverage for radar warning receivers, self protection jammers, and electronic attack receivers. The 10 GHz of instantaneous bandwidth (IBW) supported by the photonic ADCs disclosed herein should enable a single processor to capture and digitize signals up to 10 GHz without downconverters that add circuitry/filter requirements for the system. Aside from providing substantial performance enhancements in IBW for these platforms, the disclosed invention also supports antenna remoting functions.

On many airborne platforms hosting Radar Warning Receivers (RWRs) and RF counter measure (RFCM) subsystems, the antennas of the aircraft need to be positioned so that they can locate threat position and optimize signal reception. For example, on some military aircraft, the defensive antenna suites are located either in the tail boom or fuselage side fairings. These antennas then deliver signals to a receiver located in the main wheel center-bay. Presently, each antenna requires more than 10 ft of coaxial cables to connect it to a repeater, followed by several waveguide sections to complete the RF-path to the receiver. Fiber remoting will offer low loss, light weight, and EMI resistant connectivity from antenna to ADCs and digital receivers that may not be co-located with the antenna frontend. The efficiency and broadband advantages of fiber optics will also reduce the gain requirements for the antennas.

FIG. 1 depicts a diagram of a prior art Analog to Digital Converter (ADC) with a resolution of 7 Effective Number Of Bits (ENOB) for a 10 GHz analog input signal. In the photonic ADC shown in FIG. 1, two physically distinct dispersion compensating fibers (DCFs, denoted $D2^+$, $D2^{31}$ ) are used to stretch the complementary RF-modulation ($MZM^+$, $MZM^-$) available from the Electro-Optic Modulator (EOM)'s outputs. This was evidently adopted to facilitate separation of $MZM^+$ and $MZM^-$ signals for post-processing. As shown in FIG. 1, the two DCFs (for stretching the RF-modulation) were followed by two sets of EDFAs, WDM-demultiplexers and then four photodiodes that track the wavelengths $\lambda_1$ and $\lambda_2$ for $MZM^+$ and $MZM^-$, respectively, in this two channel Time-Stretch (TS) photonic ADC system.

The present invention should overcome several disadvantages associated with the prior art shown in FIG. 1. First, in FIG. 1, the two dispersion compensating fibers (DCFs) (with $\alpha\sim0.4$ dB/km), each being 180 km long the Mach Zehnder (MZ) EOM, introduce significant insertion loss that needs to be overcome via use of large gains in the Erbium Doped Fiber Amplifiers (EDFAs) following them. In the preferred embodiment of the disclosed invention, a Chirped Fiber Grating (CFG) that has intrinsic insertion losses of 1.5-2 dB while providing a dispersion $D_2$ of ~2000 psec/nm is used instead. Second, because two physically distinct dispersion elements $D2^+$, $D2^-$ and EDFAs are used for the complementary signals $MZM^+$ and $MZM^-$, two sets of post-processing algorithms are needed to correct for higher order distortions ("time warp"—see Gupta and B. Jalali, "*Time-Warp correction and calibration in photonic time-stretch analog-to-digital convert*", Optics Letters, Vol. 33, No. 22, 2008), mismatches in third order dispersion coefficients (or ones of even higher order) between $D_2$ and $D_1$, or small optical nonlinearities (due to high peak powers) in the fibers. In the preferred embodiment of the disclosed invention, only a single dispersion element is used immediately downstream of the MZ EOM.

Finally, the Time-Stretch (TS) photonic ADC system of FIG. 1, uses single element photodiodes for the photodetection of $I_1$ (corresponding to $MZM^+$) and $I_2$ (corresponding to $MZM^-$), so that the linear phase modulation $\phi(t)$ of the EOM can be recovered. In the process, the noise floors of the photodetector (PD) outputs suffer a significant degradation due to the presence of signal-spontaneous emission beat-noise that originates from the EDFAs. For EDFAs with a noise figure of $NF_{O4}$ and a gain of $G_{O4}$, the above optical amplifier noise ($Noise_{O4}$), measured over a signal bandwidth $\Delta f$, is given by:

$$Noise_{O4}=(NF_{O4}G_{O4}A)(2eI_dR_L)\Delta f \qquad \text{Eqn. 1}$$

where A is the insertion loss of the passive optical elements ($WDM_3$ and $WDM_4$ in FIG. 1) between the EDFAs and the single element PDs, $I_d$ is their DC photocurrents, and $R_L$ is their load resistances. Because the prior art subsystem does not offer any common mode rejection of the relatively intensity noise derived from the laser source or the EDFAs ($Noise_{O4}$), the SNR of the photodetector output is degraded. Therefore, the achievable ADC resolution, measured in terms of ENOB, is reduced.

Other TS photonic systems are known in the prior art. See, for example, G. Sefler, J. Conway and G. Valley, "*Wide Bandwidth, High Resolution Time-Stretch ADC Scalable to Continuous-Time Operation*", Conference on Lasers and Electro-Optics (CLEO) 2009, Baltimore and R. Walden, "*Analog-to-Digital Conversion in Early Twenty-First Century*", Wiley Encyclopedia of Computer Science and Engineering, John Wiley & Sons, 2008.

BRIEF DESCRIPTION OF THE INVENTION

In one aspect the present invention provides a photonic ADC system comprising: a laser source; a first dispersion element for chirping an output of the laser source; an electro-optic modulator with an input and complementary outputs, the input of the electro-optic modulator being coupled to receive a chirped output of the first dispersion element; a delay element coupled to one of the complementary outputs of the electro-optic modulator; a second dispersion element coupled to receive both complementary outputs of the electro-optic modulator; a single λ-demultiplexer coupled to receive a time-stretched output of the second dispersion element; and a plurality of photoreceivers coupled to outputs of the λ-demultiplexer.

In another aspect the present invention provides a method of performing analog to digital conversation of an analog signal $V_{in}(t)$, the method including the steps of: utilizing both of the complementary arms of an electro-optic modulator to recover the analog input signal $V_{in}(t)$, while using only one time-stretch element and one demultiplexer after the electro-optic modulator, the only one time-stretch element and only one demultiplexer serving to stretch and demultiplex the signals from both of the complementary output arms of the electro-optic modulator, thereby improving and simplifying post-processing algorithms used to correct for static distortions and nonlinearities that originate from imperfect photonic hardware.

DETAILED DESCRIPTION

Figure 2:
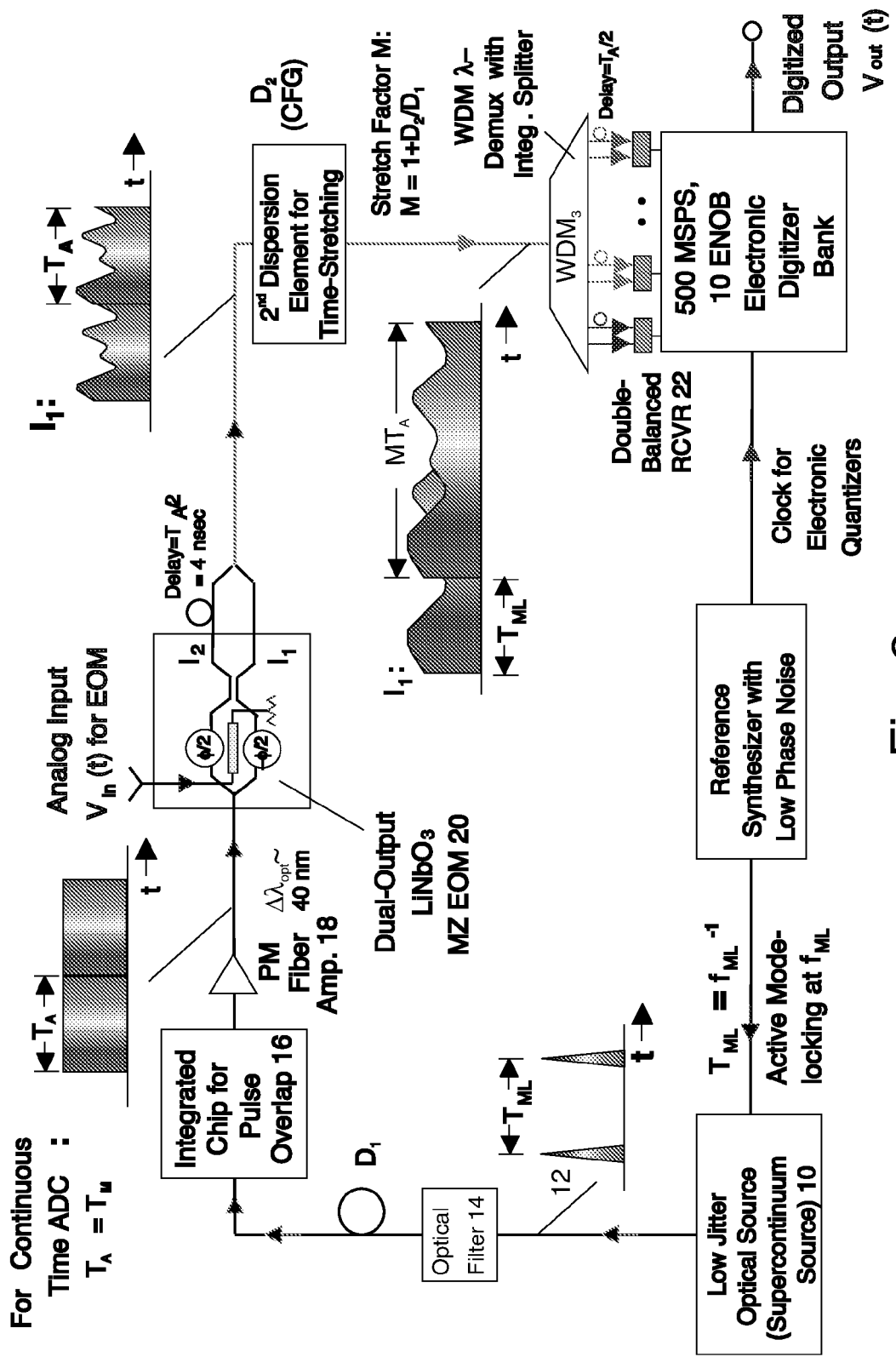
FIG. 2 is a block diagram of a preferred embodiment of the present invention. This figure shows successive pulses from one of the two complementary outputs for the Mach Zehnder EOM, and its passive, λ-demultiplexing into an electronic quantizer bank for time-interleaved digitization.
Figure 3:
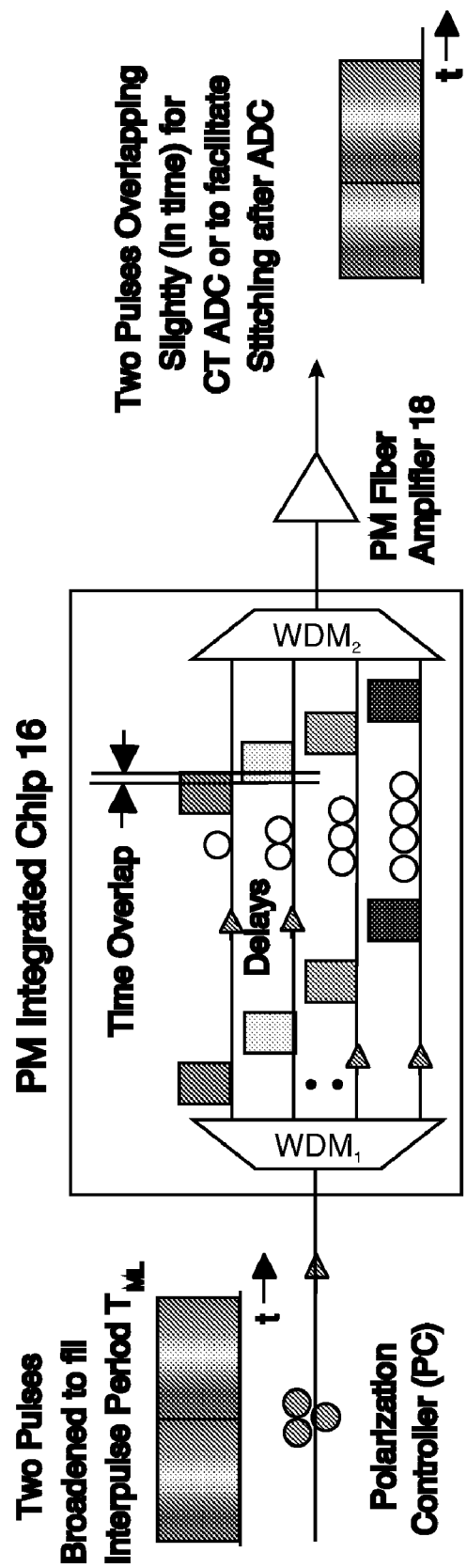
FIG. 3 is a block diagram of the PM integrated chip 16 depicted in FIG. 3.
Figure 4:
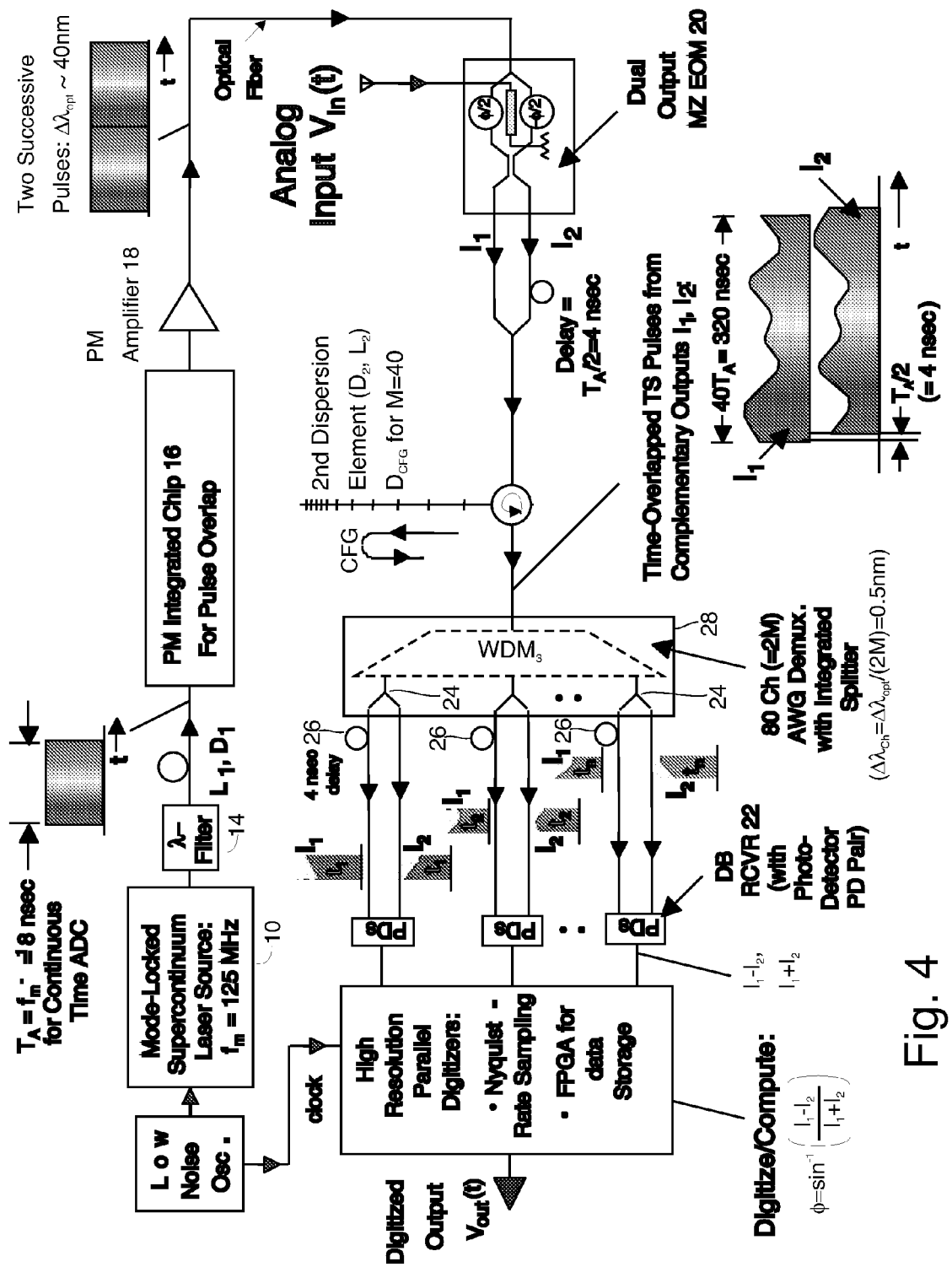
FIG. 4 is a more detailed diagram of the preferred embodiment of the present invention.

A photonic subsystem architecture is depicted in FIGS. 2 and 3 that enables one to make a high resolution (e.g., 8 to 10 ENOB), continuous time analog-to-digital converter (ADC) for a wideband (e.g., 10 GHz) RF signal modulated onto a chirped optical carrier. As shown in FIG. 2, an optical pulse train 12 generated by a mode-locked supercontinuum laser source 10 is fed to an optical filter 14, where a spectral "plateau" Δλ (preferably ~40 nm) is carved out by filter 14. The emission wavelength range of the supercontinuum laser source 10 is preferably from 1510 nm to 1610 nm, i.e., preferably near a wavelength of 1550 nm, where optical fibers have the lowest loss. The preferred spectral "plateau" of Δλ~40 nm falls within the above wavelength range. This supercontinuum plateau is then chirped and broadened by a first dispersion element $D_1$ to fill up the entire interpulse period $T_{ML}=T_A$. In FIGS. 2, 3, 4, different shades of grey are used to illustrate this wavelength chirp across the pulse.

A supercontinuum refers to a broad spectral width (Δλ) generated by directing a mode-locked, short laser pulse into a length of nonlinear fiber. In FIGS. 2 and 4 the mode-locked laser and the nonlinear fiber are lumped into a single block 10.

The output of the first dispersion element $D_1$ is applied to a polarization maintaining (PM) integrated chip 16 which is depicted in greater detail by FIG. 3. The polarization maintaining (PM) integrated chip 16 preferably has an internal or external polarization controller (PC) at its input. Thereafter a first wavelength demultiplexer $WDM_1$ has its outputs applied to integrated delay-lines which are, in turn, connected to inputs of a second wavelength multiplexer $WDM_2$. The spectral segments of the plateau that do not fall inside the guardbands of the wavelength demultiplexer are overlapped in the time domain via use of the integrated delay-lines (see FIG. 3).

A PM fiber amplifier 18, preferably connected to the output of chip 16, is preferably used to boost the amplitude of the optical output derived from chip 16. After amplification by amplifier 18, the optical signal is then fed on an optical path to a Mach Zehnder (MZ) electro-optic modulator (EOM) 20 which is designed with complementary output-arms $I_1$ and $I_2$. For continuous time (CT) ADC, the optical pulses are broadened by dispersion element $D_1$ to fill the inter-pulse period $T_{ML}$ of the optical pulse train 12.

Because the optical input to the MZ EOM 20 has been chirped by dispersion element $D_1$ and overlapped in time by chip 16, the photonic modulation process effects a time-to-wavelength (t-to-λ) mapping of the analog-input $V_{in}(t)$ signal. Subsequently, a second dispersion element $D_2$ (preferably implemented as a chirped fiber gratings (CFG)) is used to stretch the modulated signal in the time-domain. Via time-stretching, a "compression" of the analog input's bandwidth is effectively accomplished. Specifically, the time-stretch (TS) ratio M is given by: $M=1+D_2/D_1$, where $D_1$ and $D_2$ denote, respectively, the dispersion coefficients (in psec/nm) of the two dispersion elements in the photonic subsystem of FIG. 2. For example, a TS ratio of M=40 compresses a 10 GHz signal to one with a bandwidth of 250 MHz. The second dispersion element $D_2$ in FIG. 2 is coupled to the $I_1$ and $I_2$ output legs of the MZ EOM 20 with one of the two legs ($I_2$) being delayed by $T_A/2=4$ nsec in this embodiment with respect to the other leg ($I_1$).

Then a wavelength (λ) demultiplexer (identified as $WDM_3$ in FIG. 2) is used to partition the modulated signal from $D_2$ into parallel (time-interleaved) channels. In particular, the above wavelength-based de-serialization approach exploits the t-to-λ mapping feature accomplished earlier via photonic modulation. Within each channel, a high resolution electronic quantizer is preferably used to sample, preferably at Nyquist rates or above, the output of a double-balanced photoreceiver (DB RCVR) 22. The use of fiber-connectorized photonic components in this subsystem also enables one to remote/isolate $V_{in}(t)$ from the bank of electronic quantizers used to digitize the TS photodetected signal. Finally, by computing:

$$I_{out}(t) = \sin^{-1}\left(\frac{I_1 - I_2}{I_1 + I_2}\right) \qquad \text{Eqn. 2}$$

from the sampled photodetector outputs, and then reconstructing the input signal from the outputs [$I_{out}(t)$] of all the parallel channels, one obtains a digitized output $V_{out}(t)$ corresponding to the analog-input $V_{in}(t)$.

Figure 1:
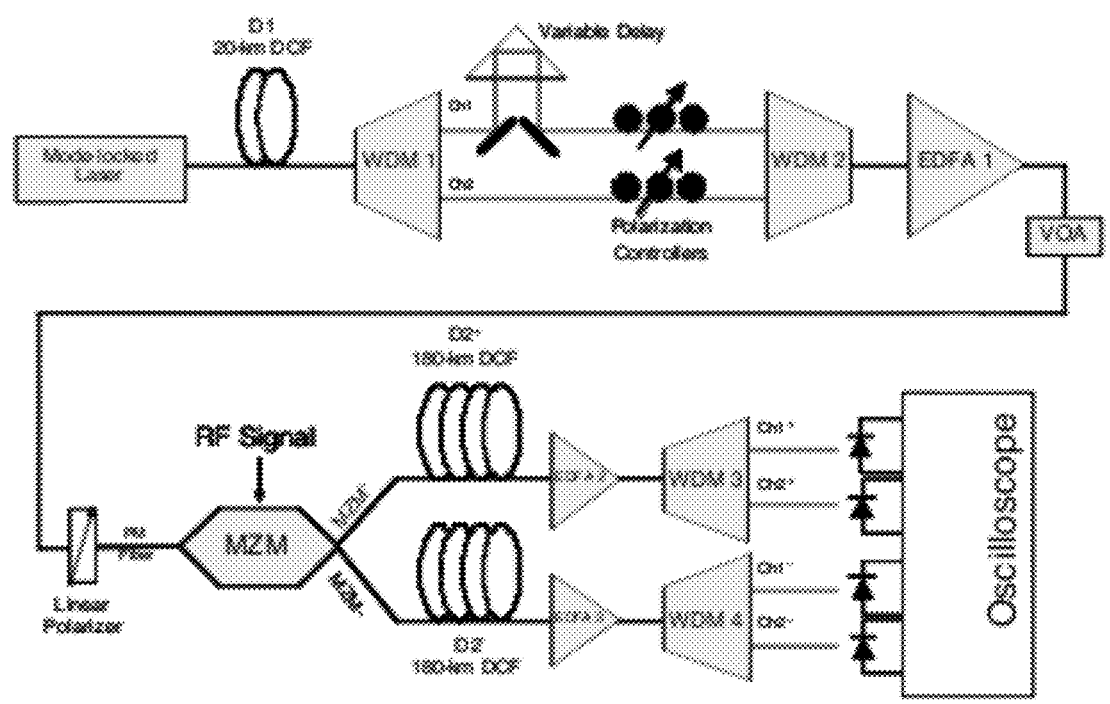
FIG. 1 is a block diagram of a prior art Analog to Digital Converter (ADC) with a resolution of 7 Effective Number Of Bits (ENOB) for a 10 GHz analog input signal.

Note that an optical amplifier 18 (e.g., an EDFA) is preferably placed before the MZ EOM 20 to minimize the impact of optical amplifier noise (see Eqn. 1) on the noise floor of the photoreceiver, as opposed to putting it after D2$^+$ and D2$^-$, as done in the prior art (cf. FIG. 1).

Although TS photonic ADC systems have been demonstrated in the past, the disclosed architecture presents an approach that can support high resolution ADC under CT operation, with the use of only one time-stretch element $D_2$ and one λ-demultiplexer after the MZ EOM 20. Hence, $D_2$ and $WDM_3$ (see FIG. 2) serve to stretch and demultiplex the signals from both output arms ($I_1$ and $I_2$) of the MZ EOM 20. In particular, the disclosed architecture substantially simplifies the post-processing algorithms used to correct for static distortions and nonlinearities that originate from imperfect photonic hardware. In addition, the signal to noise ratio (SNR) of the photodetected signals is preferably significantly enhanced by employing double-balanced photoreceivers (DB RCVRs) 22 at each output port of the λ-demultiplexer WDM$_3$. The use of DB RCVRs 22 enable rejection of common-mode relative intensity noise (RIN) derived from the laser or the Er-doped fiber amplifiers (EDFAs) used in the disclosed photonic subsystem. In this manner, the SNR of the photodetector outputs in the disclosed photonic subsystem is enhanced substantially over previous TS photonic ADC systems that use a single element photodetector in the optical receiver. It is expected that a SNR (e.g., 62 dB over 10 GHz) will be achieved, which breaks the present barrier for high resolution in wideband ADC technologies.

FIG. 4 depicts a more detailed schematic of the CT TS photonic ADC system that constitutes the preferred embodiment of this invention.

As shown in FIG. 4, a mode-locked (ML) supercontinuum laser source 10 (with repetition frequency $f_{ML}$) is used to generate a spectral "plateau" 12 that has a width Δλ, in this embodiment, of ~40 nm. In particular, the above spectral width was selected to incur minimal wavelength sensitivity for a LiNbO$_3$ MZ EOM preferably utilized to accomplish a mapping of t-to-λ for the analog input $V_{in}(t)$. After filtering as described above with reference to FIG. 2a, the supercontinuum pulses are fed to a first dispersion element D$_1$ (for example, in this embodiment, a length L$_1$ of DCF with dispersion coefficient D$_1$ ~200 psec/nm). By the use of dispersion in D$_1$, the short pulses 12 from the supercontinuum laser source 10 are broadened (see FIG. 3) to fill the entire pulse repetition period, so that $T_A = T_{ML}(=f_{ML}^{-1})$. For a given Δλ, the above requirement for achieving CT ADC is met by making $T_{ML}=D_1\Delta\lambda$. In designing $T_{ML}$ and D$_1$, one should preferably also take into account that the first dispersion null ($f_{null}$)—given by $f_{null}=[c/(2\lambda^2 D_1)]^{0.5}$ in GHz—should be placed sufficiently far away from the input bandwidth, so that "fading" of the RF modulation due to dispersion penalty in the photonic ADC subsystem is minimized. An exemplary embodiment might use a pulse repetition frequency $f_{ML}$ of ~125 MHz to provide a time-aperture $T_A(=T_{ML})$ of 8 nsec for the MZ EOM 20. As mentioned earlier, the supercontinuum pulse train is also chirped by D$_1$ to provide the previously mentioned t-to-λ mapping of the analog-input $V_{in}(t)$ via electro-optic modulation in the MZ EOM 20.

The broadened and chirped pulses then go through the polarization maintaining (PM) integrated chip 16 (see FIG. 3) that serves to accomplish some degree of "time-overlap" between the pulses. Using a designed time-overlap, the analog-input coming in at a specific time instant $t_i$ can be impressed simultaneously on a common, narrow spectral segment. After passive demultiplexing by WDM$_3$ (see FIG. 4) further down the chain, the "congruent" RF-modulation can then be exploited to "stitch" together adjacent time-segments. In this manner, time-interleave errors due to channel mismatches are minimized. In addition, the above device can be used to overlap (in time) spectral segments that lie in the passbands of AWG-based WDM demultiplexers, so that modulated time-samples do not fall in between the passbands, i.e., in the guard bands of WDM$_3$. After passage through the above PM integrated chip 16, the pulse train is preferably amplified by a polarization maintaining (PM) fiber amplifier 18 to boost its optical power, and then fed to a EOM 20 where the analog input $V_{in}(t)$ is modulated onto the chirped optical pulses. To recover the linear phase modulation due to $V_{in}(t)$, a Mach Zehnder (MZ) EOM 20 is utilized which is designed with complementary outputs I$_1$ and I$_2$. Specifically, I$_1$ and I$_2$ are given, respectively, by: $I_1=I_o[1+\sin(\phi(t))]$, $I_2=I_o[1-\sin(\phi(t))]$, where $I_o$ is the maximum transmission from either arm; $\phi(t)$ is the differential phase between the two arms, and is given by $\phi(t)=(\pi/V_\pi)[V_{bias}+V_{in}(t)]$. Therefore, when biased at quadrature, the analog-input (RF modulation) can be recovered as:

$$V_{in}(t) = \frac{V_\pi}{\pi}\sin^{-1}\left(\frac{I_1 - I_2}{I_1 + I_2}\right) \qquad \text{Eqn. 3}$$

The improvement in signal de-serialization is now discussed in greater detail. As shown in FIG. 3, only one dispersive element D$_2$ is utilized to stretch the signals derived from both output arms (I$_1$ and I$_2$) of the MZ EOM 20. To obtain a stretch ratio M (=1+D$_2$/D$_1$) of 40, for example, concatenated chirped fiber gratings (CFG) are preferably utilized that exhibit an aggregate dispersion coefficient of D$_2$ ~8000 psec/nm. As mentioned earlier, a stretch ratio of M=40 compresses the bandwidth of $V_{in}(t)$ by the same factor. This, in turn, allows one to use parallel electronic quantizers that possess a Nyquist bandwidth 1/40 of $V_{in}(t)$ to digitize signals de-serialized by WDM$_3$. The recovery of the analog-input $V_{in}(t)$ via Eqn. 3 is, however, only exact if the signal-stretching is perfectly linear. If small optical nonlinearities (e.g., phase-ripples in the CFG, "time-warps") are present, one needs to use post-processing algorithms to correct for them.

The use of only a single dispersion element D$_2$ after the EOM 20 (as opposed to two dispersion elements as done in the prior art of FIG. 1) will substantially improve, as well as simplify, the correction of static distortions in the TS photonic ADC's frontend. To provide for the installation of only one D$_2$ element and one WDM-demux (WDM$_3$) after the EOM 20, and still maintain two distinguishable outputs I$_1$ and I$_2$ for subsequent photodetection, I$_2$ is time-delayed with respect to I$_1$ by $T_{ML}/2$ (=4 nsec in this embodiment), so that they can be separated after passing WDM$_3$ in the time domain. Specifically, after stretching by M=40 times, the width of the ML pulses becomes $T_{stretch}$=320 nsec (=8 nsec×40) in this embodiment. Hence, the wavelength-chirp (λ-chirp) across the stretched pulses becomes 0.125 nm/nsec (=$\Delta\lambda_{opt}/T_{stretch}$, $\Delta\lambda_{opt}$=40 nm) in this embodiment. Using an array waveguide grating (AWG) λ-demux WDM$_3$ that has a channel (Ch) separation ($\Delta\lambda_{CH}$) of 0.5 nm for this embodiment, the pulses coming from each channel of WDM$_3$ are ~4 nsec wide [=$\Delta\lambda_{CH}$/λ-chirp, where λ-chirp=0.125 nm/sec] in this embodiment. Since I$_2$ from the MZ EOM 20 has been delayed by 4 nsec from I$_1$ in this embodiment, the above $\Delta\lambda_{CH}$ allows the complementary RF-modulation (I$_1$, I$_2$) within each channel of WDM$_3$ to be separated, in time, during continuous time (CT) operation. It should be mentioned, in passing, that a λ-demux with a channel spacing $\Delta\lambda_{CH}$ of 0.5 nm lies well within the state-of-the-art of silica AWG technology, where the $\Delta\lambda_{CH}$ of low insertion loss, ITU-grid aligned AWGs (designed for telecommunication purposes) has become as small as 25 GHz or 0.2 nm.

The MZ EOM 20, the high resolution parallel digitizers, FPGA memory, AWG demux w/splitters, etc shown and/or described with reference to FIGS. 2, 3 and 4 are standard off the shelf components.

The improvement in signal reconstruction is now discussed in greater detail. As shown in FIG. 1 that illustrates an example of the prior art, each output arm of the MZ EOM 20 was detected by separate photodiodes, one for each λ. However, these single-element photodiodes do not provide common-mode rejection of noise that originates from the laser (relative intensity noise RIN) or the optical amplifiers, especially those due to EDFA$_2$/EDFA$_3$ in FIG. 1. In the present invention, double-balanced (DB) receivers (RCVRs) 22 are preferably used to photodetect the complementary RF-modulations $I_1$ and $I_2$. Using DB RCVRs 22, one can obtain $I_1-I_2$ directly as its RF-output, and $I_1+I_2$ from the bias-ports of the photodiodes. As shown in the SNR analysis below, the employment of DB detection will enhance the SNR by more than 20 dB (for the same DC photocurrent) over the prior art 7 ENOB TS ADC system of FIG. 1. One can digitize and compute $\sin^{-1}[(I_1-I_2)/(I_1+I_2)]$ (see Eqn. 3) to recover the perfectly linear phase-modulation $\phi(t)$. To use DB photodetection in conjunction with the present WDM-deserialization scheme, the complementary RF-modulation ($I_1$ and $I_2$) is re-aligned in time via use of a 3-dB splitter 24 that can be monolithically integrated with the AWG demultiplexer $WDM_3$ 28 if desired. After applying a $T_{ML}/2$ (=4 nsec) delay to $I_1$ in this embodiment (see FIG. 4), the complementary RF-modulation $I_1$ and $I_2$, for time-slots $t_i$, (i=1,2, . . . n) are now re-aligned in time for double-balanced photodetection. These short 4 nsec waveguide-delay-lines 26 can be integrated as silica-waveguide chips on 6" (for example) wafers that butt against the AWG-chip 28, if desired.

Finally, it should be noted that the use of a higher resolution $WDM_3$ followed by the above time-realignment allows one to obtain extra sampled data points for signal reconstruction. Using the following reconstruction algorithm, every time-segment $t_i$ (each 4 nsec wide in this embodiment) derived from $I_1$ or $I_2$ can be used to: either recover the linear phase modulation $\phi(t)$ via use of the $\sin^{-1}$ algorithm (see Eqn. 3), or to acquire sampled data that help facilitate segment-stitching of the time-interleaved channels. Briefly, from the sampled data for $I_1 \pm I_2$ in time-slot $t_1$, one can obtain $I_1(t_1)$ and $I_2(t_1)$ exactly. (The designed separation between $t_i$ and $t_{i+1}$ in the embodiment of FIG. 3 is $T_{ML}$=8 nsec.) The 4 nsec time-interval between time-segments $t_1$ and $t_2$ of FIG. 4 contains the signals $I_2(t_1)/2$ and $I_1(t_2)/2$. Since $I_2(t_1)$ is known, one can calculate $I_1(t_2)/2$ from the DB RCVR's output $[I_2(t_1)-I_1(t_2)]/2$. The computed value for $I_1(t_2)/2$ is additional data one can apply to accomplish more accurate segment stitching, and is an artifact of using a higher resolution $WDM_3$ to achieve de-serialization of the RF-modulation. Hence, no optical power is wasted in the disclosed de-serialization scheme. Finally, by time-stretching a 10 GHz analog-input to 250 MHz, the surface-coupled photodiodes of the DB RCVR can be substantially larger in diameter (>5 times) to enhance photodetection linearity and responsivity.

An analysis of the signal-to-noise ratio (SNR) for the disclosed TS ADC system shown in FIG. 3 is now presented. First, by placing the EDFA 18 further up the link (i.e., closer to the laser source 10), one can minimize the impact of optical amplifier noise, i.e., beat-noise between signal and spontaneous-emission in the EDFA, on the SNR. This is an improvement over the prior art shown in FIG. 1. Using the above scheme in conjunction with DB photodetection, one can improve the SNR by >20 dB (=3.3 bits) to enhance the ENOB from 7 bits (established by the prior art of FIG. 1) to as much as 10 bits. In the disclosed TS ADC system, an EDFA will preferably still be used to boost the SNR ($\propto I_d$ in the shot-noise limited regime) at the receiver, so that one can obtain a DC photocurrent $I_d$ large enough to provide an SNR of ~62 dB (i.e., 10 ENOB) over an IBW of 10 GHz. In the amplification process, one should minimize the degradation of SNR due to optical amplifier noise $N_{OA}$, which is given by Eqn. 1. If 0.3 mA $<I_d<$100 mA, the dominant sources of noise at a photoreceiver (with no post-amplifier) is the optical amplifier noise and the shot-noise, which are much larger than the thermal (kT) noise or laser noise (for a RIN <–165 dB/Hz). For an optical modulation index m, the SNR of a TS photonic ADC system (such as the prior art shown in FIG. 1) employing a single-element photodetector (that does not reject common mode noise) is:

$$SNR_{OA} = \frac{m^2 I_d/(4e)}{1+(NF_{OA}G_{OA}A)} = \frac{SNR_o}{1+(NF_{OA}G_{OA}A)} \quad \text{Eqn. 4}$$

Figure 5:
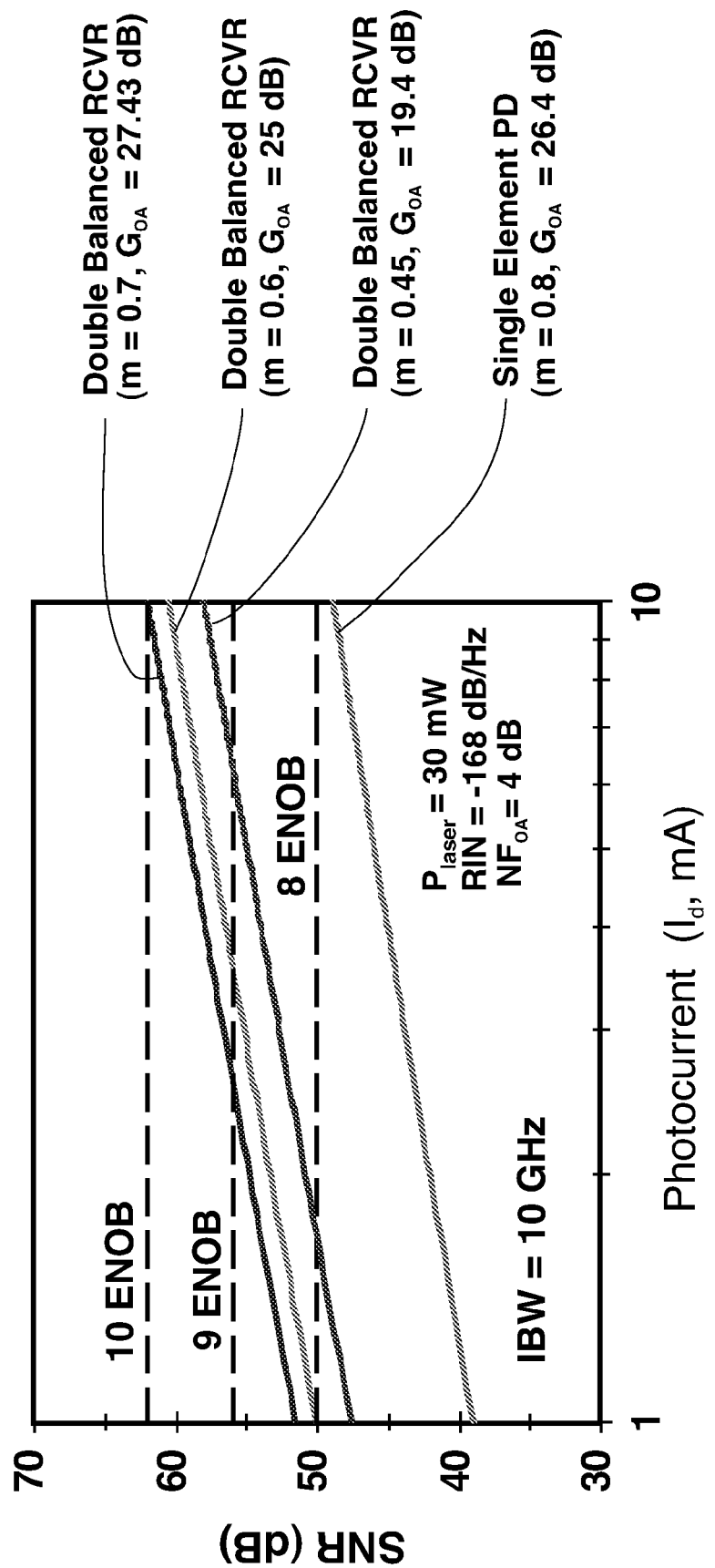
FIG. 5 presents plots of the SNR vs Photocurrent $I_d$ (per PD). The plots are for optical parameters designs of: a single element PD (the lower most plot), and three different parameter designs for double balanced photodetection (the three upper most plots).

In the above equation, the numerator $SNR_o$ is the shot noise limited SNR for a single element photodetector, and A is an attenuation factor modeling the total optical loss (e.g., due to $WDM_3$) between the output of the EDFA and the photoreceiver. From the above equation, one can see that for the same $G_{OA}$, $SNR|_{OA} \approx SNR_o$ if one places the EDFA further up the link, so that the product $NF_{OA}G_{OA}A$ becomes $<<1$ due to the attenuation factor A. The lower most curve of FIG. 5 shows the SNR obtained by placing the EDFA 18 before the MZ EOM 20, as shown in FIG. 3, but with use of a single element photodetector (PD) at the receiver. So even without DB photodetection, the improvement of SNR over the prior art architecture of FIG. 1 is ~8-10 dB. The upper three curves of FIG. 5 show the SNR expected to be obtained when double-balanced photodetection is utilized. The topmost curve corresponds to m=0.7, $G_{OA}$=27.43 dB, the next curve down corresponds to m=0.6, $G_{OA}$=25 dB while the third of the top three curves corresponds to m=0.45, $G_{OA}$=19.4 dB.

Using DB photodetection, the EDFA amplifier noise from the EDFA 18 is incident on the photodetector pair as common mode noise that is differentially rejected. Therefore, one can essentially neglect the second factor in the denominator of Eq. 4, and consider the DB RCVR noise floor as shot-noise dominated. Since the signal power is quadrupled ($I_d$ is doubled), and the shot-noise is only doubled in a DB RCVR, the signal to noise ratio, $SNR_{DB}$, for the present invention is:

$$SNR_{DB} = \frac{m^2 I_d}{2e\Delta f} \quad \text{Eqn. 5}$$

which is 3 dB higher than that of a single element PD with the same $I_d$. Using an $I_d$ of ~10 mA, m=0.7 ($G_{OA}$ ~27.43 dB), for example, one will attain an $SNR_{DB}$ of 62 dB for 10 ENOB (over IBW=10 GHz). As shown, the SNR enhancement via use of DB photodetection (compared to single element photodetection) is >10 dB for the same m and $G_{OA}$. Therefore, one should obtain a total SNR-gain of >20 dB (over the 7 ENOB system of the prior art shown in FIG. 1), for an ENOB enhancement of 3.3 bits when utilizing the present invention.

It should be understood that the above-described embodiments are merely some possible examples of implementations of the presently disclosed technology, set forth for a clearer understanding of the principles of this disclosure. Many more variations and modifications may be made to the above-described embodiments of the invention without departing substantially from the principles of the invention. All such modifications and variations are intended to be included herein within the scope of this disclosure and the present invention and protected by the following claims.

What is claimed is:
1. A photonic ADC system comprising:
a supercontinuum laser source for generating an optical pulse train;

a first dispersion element for chirping an output of the supercontinuum laser source and for filling inter-pulse periods between pulses in the optical pulse train from the supercontinuum laser;

an electro-optic modulator with an input and complementary outputs, the input of the electro-optic modulator being coupled to receive an output of the first dispersion element;

a first delay element coupled to one of the complementary outputs of the electro-optic modulator;

a second dispersion element coupled to receive both complementary outputs of the electro-optic modulator, the second dispersion element comprising a single dispersion element;

a wavelength demultiplexer coupled to receive a time-stretched output of the second dispersion element, the wavelength demultiplexer having a plurality of outputs;

a plurality of optical splitters, each one of said plurality of optical splitters having an input coupled to one of the outputs of the wavelength demultiplexer and each splitter also having a pair of outputs;

a plurality of second delay elements, each one of the plurality of second delay elements being coupled to one of the outputs of each of said plurality of optical splitters; and a plurality of double balanced photoreceivers, each one of the plurality of doubled balanced photoreceivers being coupled to the outputs of a corresponding one of the plurality of optical splitters so the each one of the plurality of doubled balanced photoreceivers receives one output of the corresponding one of the plurality of optical splitters which is delayed by a corresponding one of said plurality of second delay elements, and wherein the first delay element and each second delay element all impose identical amounts of delay.

2. The photonic ADC of claim 1 further including a filter/time delay element disposed between the first dispersion element and the input of the electro-optic modulator.

3. The photonic ADC of claim 2 wherein the electro-optic modulator is a Mach Zehnder electro-optic modulator having a modulator input for receiving an analog input signal $V_{in}(t)$.

4. The photonic ADC of claim 3 wherein the second dispersion element comprises a time-stretch element.

5. The photonic ADC of claim 4 wherein the second dispersion element is a chirped fiber grating.

6. The photonic ADC of claim 5 wherein a fiber amplifier is disposed between the filter/time delay element and the input of the electro-optic modulator.

7. The photonic ADC of claim 1 wherein the first delay element and each second delay element all impose identical amounts of delay.

8. The photonic ADC of claim 1 wherein no optical amplification occurs between the complementary outputs of the electro-optic modulator and the plurality of photoreceivers.

9. The photonic ADC of claim 1 wherein the supercontinuum laser source has an emission wavelength range between 1510 nm and 1610 nm.

10. In a method of performing analog to digital conversation of an analog signal $V_{in}(t)$, the method including the steps of:

utilizing both of the complementary arms ($I_1$ and $I_2$) of an electro-optic modulator (EOM) to recover the analog input signal $V_{in}(t)$, the electro-optic modulator (EOM) receiving at an optical input thereof a stream of over-lapped in time optical signals in which all gaps between adjacent optical signals are filled by overlapping same;

using only one time-stretch element ($D_2$) and a frequency demultiplexer ($WDM_3$) after the electro-optic modulator (EOM), said only one time-stretch element ($D_2$) and the frequency demultiplexer ($WDM_3$) serving to stretch and demultiplex the signals from both of the complementary output arms ($I_1$ and $I_2$) of the electro-optic modulator (EOM), splitting outputs of the frequency demultiplexer ($WDM_3$) into a plurality of signal pairs;

delaying one signal of each signal pair in order to align signals from the complementary output arms ($I_1$ and $I_2$) in time in each signal pair and applying the plurality of signal pairs to a plurality of double balanced photoreceivers.

11. The method of claim 10 wherein the electro-optic modulator is a Mach Zehnder electro-optic modulator having a modulator input for receiving the analog signal $V_{in}(t)$.

12. The method of claim 11 wherein the time-stretch element comprises a dispersion element.

13. The method of claim 12 wherein the dispersion element is a chirped fiber grating.

14. The method of claim 10 wherein double balanced photodetection occurs at outputs of the frequency demultiplexer.

15. The method of claim 14 wherein no optical signal amplification occurs between the electro-optic modulator and photodetectors utilized in said double balanced photodetection.

16. The method of claim 10 further including:
generating a frequency chirped optical signal; and
supplying the frequency chirped optical signal to an input of the electro-optic modulator.

17. The method of claim 16 wherein frequency chirped optical signal has a wavelength range of 1510 nm to 1610 nm.

* * * * *